US012775393B2

(12) United States Patent
Eliash et al.

(10) Patent No.: US 12,775,393 B2
(45) Date of Patent: Oct. 27, 2026

(54) ERROR DETECTION FOR PROGRAMMING SINGLE LEVEL CELLS

(71) Applicant: Micron Technology, Inc., Boise, ID (US)

(72) Inventors: Tomer Tzvi Eliash, Sunnyvale, CA (US); Yu-Chung Lien, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 18/797,445

(22) Filed: Aug. 7, 2024

(65) Prior Publication Data

US 2025/0044953 A1 Feb. 6, 2025

Related U.S. Application Data

(63) Continuation of application No. 17/871,804, filed on Jul. 22, 2022, now Pat. No. 12,067,255.

(51) Int. Cl.

| | |
|---|---|
| ***G06F 3/06*** | (2006.01) |
| ***G01R 19/165*** | (2006.01) |
| ***G06F 11/07*** | (2006.01) |
| ***G11C 29/08*** | (2006.01) |
| ***G11C 29/50*** | (2006.01) |

(52) U.S. Cl.

CPC ......... *G06F 3/0619* (2013.01); *G01R 19/165* (2013.01); *G06F 3/064* (2013.01); *G06F 3/0673* (2013.01); *G06F 11/073* (2013.01); *G06F 11/0769* (2013.01); *G11C 29/08* (2013.01); *G11C 29/50004* (2013.01)

(58) Field of Classification Search

CPC ...... G06F 3/0619; G06F 3/064; G06F 3/0673; G06F 11/073; G06F 11/0769; G06F 11/10; G01R 19/165; G11C 29/08; G11C 29/50004; G11C 5/145; G11C 7/222; G11C 11/5628; G11C 16/10; G11C 16/30; G11C 2029/0409; G11C 2029/0411; G11C 2207/2236; G11C 29/52

See application file for complete search history.

(56) References Cited

U.S. PATENT DOCUMENTS

| | | | | |
|---|---|---|---|---|
| 5,559,956 A * | 9/1996 | Sukegawa | G11C 16/10 | 714/6.13 |
| 6,205,055 B1 * | 3/2001 | Parker | G11C 16/12 | 365/185.28 |
| 6,473,338 B2 * | 10/2002 | Sugimura | G11C 27/005 | 365/185.21 |

(Continued)

*Primary Examiner* — Steve N Nguyen

(74) *Attorney, Agent, or Firm* — Holland & Hart LLP

(57) ABSTRACT

Methods, systems, and devices for error detection for programming single level cells of a memory system are described. The memory system may receive a write command for writing data to a block of memory cells and generate a write voltage to write the data to the block of memory cells. The memory system may compare the write voltage to a reference voltage and determine whether the write voltage satisfies a threshold tolerance associated with the reference voltage. The memory system may generate signaling indicating an error associated with writing the data to the block of memory cells, based on determining that the write voltage does not satisfy the threshold tolerance.

18 Claims, 7 Drawing Sheets

(56) References Cited

U.S. PATENT DOCUMENTS

| | | | | |
|---|---|---|---|---|
| 2005/0248992 | A1* | 11/2005 | Hwang | G11C 16/3454 365/185.28 |
| 2005/0270848 | A1* | 12/2005 | Chae | G11C 16/3459 365/185.23 |
| 2006/0044923 | A1* | 3/2006 | Hahn | G11C 16/0483 365/230.06 |
| 2007/0183205 | A1* | 8/2007 | Lee | G11C 16/30 257/E29.302 |
| 2007/0263469 | A1 | 11/2007 | Cornwell et al. | |
| 2011/0044113 | A1* | 2/2011 | Kim | G11C 16/12 365/185.18 |
| 2017/0068481 | A1* | 3/2017 | Yoo | G06F 3/0611 |
| 2019/0341120 | A1 | 11/2019 | Zehavi et al. | |
| 2020/0227103 | A1* | 7/2020 | Shao | G11C 8/20 |
| 2022/0076762 | A1 | 3/2022 | Lee et al. | |

* cited by examiner

700

ERROR DETECTION FOR PROGRAMMING SINGLE LEVEL CELLS

The present application for patent is a continuation of U.S. patent application Ser. No. 17/871,804 by Eliash et al., entitled "ERROR DETECTION FOR PROGRAMMING SINGLE LEVEL CELLS," filed Jul. 22, 2022, assigned to the assignee hereof, and is expressly incorporated by reference in its entirety herein.

FIELD OF TECHNOLOGY

Field of Technology

The following relates to one or more systems for memory, including error detection for programming single level cells.

Background

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A memory system may receive a write command from a host system instructing the memory system to write data to one or more memory cells. In some cases, the one or more memory cells may be operated as single level memory cells (SLCs), where the memory system may apply a voltage pulse (e.g., a write pulse) to write one bit of data per cell. In some examples, the data may be written to the respective memory cells without a subsequent verification operation in order to decrease the memory system's latency (e.g., by avoiding the time needed for a verification operation). However, in some implementations, omitting the verification operation may result in invalid data being stored to the memory cells, and the errors may cause access latency, data security concerns, decreased operational reliability, and system failure, among other issues. Therefore a system configured to verify the accuracy of stored data while operating with a relatively low latency may be desirable.

In accordance with examples as disclosed herein, a memory system configured to verify the accuracy of stored data while operating with a relatively low latency is described. For example, the memory system may utilize circuitry (e.g., comparison circuitry) to determine (e.g., compare) a write voltage (e.g., a voltage used to write one or more memory cells) and an expected (e.g., theoretical) voltage to write the data to the one or more memory cells. In some cases, the memory system may determine whether the actual voltage is different than the expected voltage, which may trigger the memory system to determine whether the data (e.g., the data written to the one or more memory cells) includes one or more errors. In such cases, the memory system may pause any ongoing operations (e.g., access operations) and determine whether one or more errors exist in the previously written data. For example, the memory system may decode the data written to the memory cells to determine the existence of one or more errors. In some cases where the decoding detects the error occurred, the data may be written (e.g., rewritten) to a different portion (e.g., a different block) of the memory system and the invalid block (e.g., the block containing the error) may be erased or disabled. Because a verification operation may be selectively performed (e.g., not performed after each write operation), the memory system will operate with a relatively low latency while also ensuring the validity of data stored to its memory cells, among other advantages.

Figure 1:
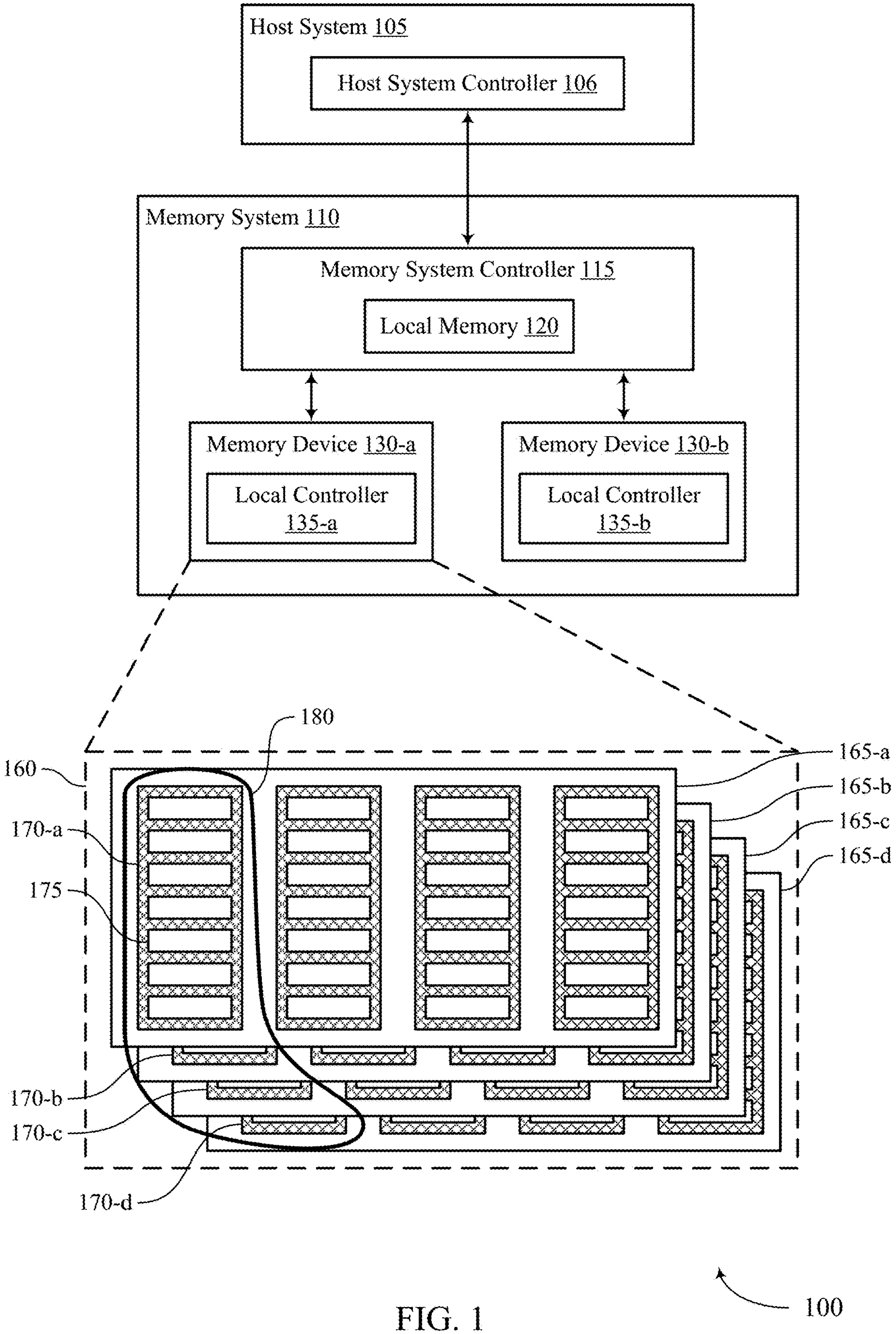
FIG. 1 illustrates an example of a system that supports error detection for programming single level cells in accordance with examples as disclosed herein.
Figure 2:
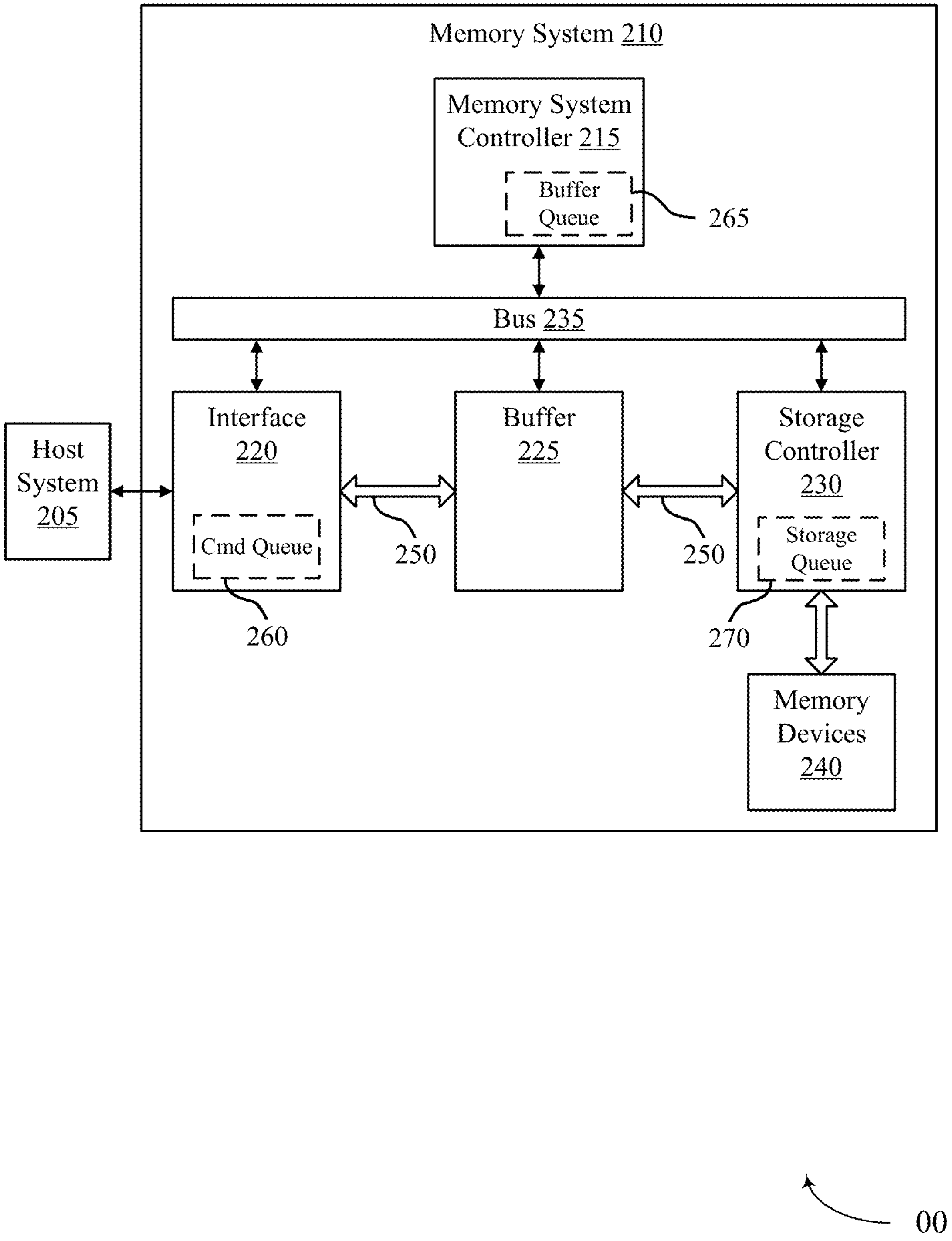
FIG. 2 illustrates an example of a system that supports error detection for programming single level cells in accordance with examples as disclosed herein.

Features of the disclosure are initially described in the context of systems, devices, and circuits with reference to FIGS. 1 and 2. Features of the disclosure are described in the context of systems, circuits, and process flows with reference to FIGS. 3 through 5. These and other features of the disclosure are further illustrated by and described in the context of an apparatus diagram and flowchart that relate to error detection for programming single level cells with reference to FIGS. 6 and 7.

FIG. 1 illustrates an example of a system 100 that supports error detection for programming single level cells in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof.

Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation).

Further, in some cases, NAND memory cells may be erased before they can be rewritten with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The system 100 may include any quantity of non-transitory computer readable media that support error detection for programming single level cells. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some examples, the memory system 110 may utilize circuitry (e.g., comparison circuitry) to compare a write voltage (e.g., a voltage used to write one or more memory cells) with an expected (e.g., theoretical) voltage to write the data to the one or more memory cells. In some cases, the memory system 110 may determine whether the actual voltage is different than the expected voltage, which may trigger the memory system 110 to determine whether the data (e.g., the data written to the one or more memory cells) includes one or more errors. In such cases, the memory system 110 may pause any ongoing operations (e.g., access operations) and determine whether one or more errors exist in the previously written data. For example, the memory system 110 may decode the data written to the memory cells to determine the existence of one or more errors. In some cases where the decoding detects the error occurred, the data may be written (e.g., rewritten) to a different portion (e.g., a different block) of the memory system 110 and the invalid block (e.g., the block containing the error) may be erased or disabled. Because a verification operation may be selectively performed (e.g., not performed after each write operation), the memory system 110 may operate with a relatively low latency while also ensuring the validity of data stored to its memory cells.

FIG. 2 illustrates an example of a system 200 that supports error detection for programming single level cells in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, after completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. After receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

After a determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, performing garbage collection). The entries may be added to the storage queue 270, e.g., by the memory system controller 215. The entries may be removed from the storage queue 270 (e.g., by the storage controller 230 or memory system controller 215) after completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some examples, the memory system 210 may utilize circuitry (e.g., comparison circuitry) to compare a write voltage (e.g., a voltage used to write one or more memory cells) with an expected (e.g., theoretical) voltage to write the data to the one or more memory cells. In some cases, the memory system 210 may determine whether the actual voltage is different than the expected voltage, which may trigger the memory system 210 to determine whether the data (e.g., the data written to the one or more memory cells) includes one or more errors. In such cases, the memory system 210 may pause any ongoing operations (e.g., access operations) and determine whether one or more errors exist in the previously written data. For example, the memory system 210 may decode the data written to the memory cells to determine the existence of one or more errors. In some cases where the decoding detects the error occurred, the data may be written (e.g., rewritten) to a different portion (e.g., a different block) of the memory system 210 and the invalid block (e.g., the block containing the error) may be erased or disabled. Because a verification operation may be selectively performed (e.g., not performed after each write operation), the memory system 210 may operate with a relatively low latency while also ensuring the validity of data stored to its memory cells.

Figure 3:
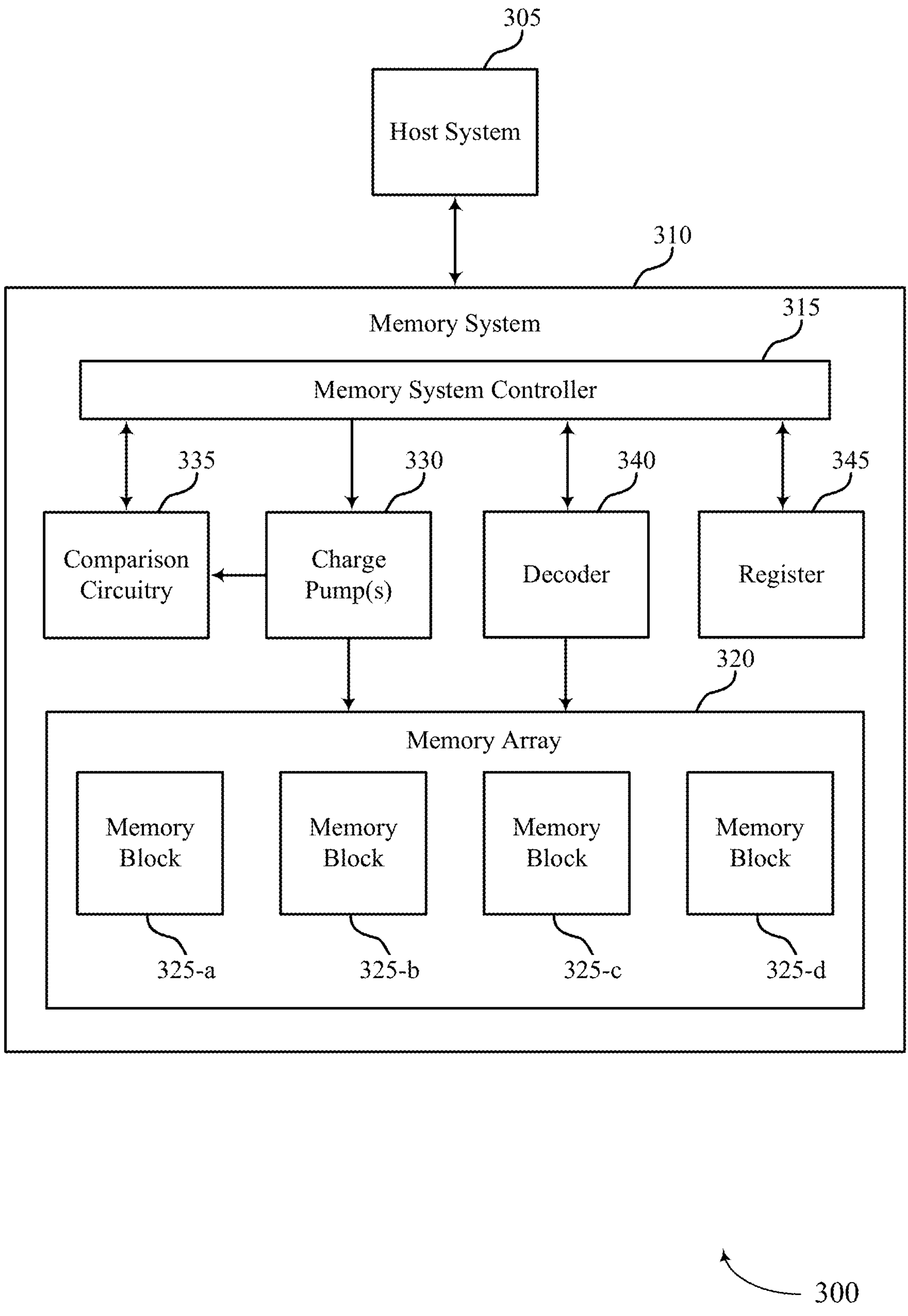
FIG. 3 illustrates an example of a system that supports error detection for programming single level cells in accordance with examples as disclosed herein.

FIG. 3 illustrates an example of a system 300 that supports error detection for programming single level cells in accordance with examples as disclosed herein. The system 300 may be an example of and implement aspects of a system 100 or a system 200 as described with reference to FIG. 1 and FIG. 2, respectively. For example, host system 305 and memory system 310 may be examples of the host system 105 or 205 and the memory system 110 or 210, respectively. Aspects of the system 300 may be omitted from FIG. 3 for illustrative clarity. In some cases, the memory system 310 may detect one or more errors associated with writing data to memory cells of the memory system 310 based on comparing a voltage used to write data (e.g., a write voltage) to a reference (e.g., expected or theoretical) voltage to write the data to the memory cells. By selectively determining whether data includes one or more errors, the memory system 310 may operate with a relatively low latency while also ensuring the validity of data stored to its memory cells.

The memory system 310 may include a memory system controller 315 configured to receive commands (e.g., write commands) from the host system 305 and communicate with other components of the memory system 310 to process the commands. The memory system 310 may include a memory array 320, where the memory array may be an example of a non-volatile memory array (e.g., a NAND memory array). The memory array may include a plurality of memory blocks 325 (e.g., memory block 325-*a*, memory block 325-*b*, memory block 325-*c*, and memory block 325-*d*). As described herein, each memory block 325 may include one or more memory cells that may be operated as SLCs (e.g., memory cells configured to each store one bit of data). Further, each memory block 325 may include one or more memory cells that may be operated as MLCs (e.g., memory cells configured to each store two bits of data), TLCs (e.g., memory cells configured to each store three bits of data) or QLCs (e.g., memory cells configured to each store multiple bits of data).

The memory system 310 may include one or more charge pumps 330, where each charge pump 330 may be coupled with one or more memory blocks 325. For example, each memory array 320 of the memory system 310 or each memory block 325 of the memory system 310 may be associated with a respective charge pump 330. Each charge pump 330 may be activated to provide a voltage (e.g., a write voltage) used to write data to the memory cells of a respective memory block 325.

The memory system 310 may include comparison circuitry 335 coupled with the one or more charge pumps 330 and the memory system controller 315. The comparison circuitry 335 may include a divider coupled with each charge pump 330 of the one or more charge pumps 330, and further coupled with a comparator. The divider may be configured to divide (e.g., by a factor) the voltage generated by the respective charge pump 330 for writing the data to one or more memory cells. For example, a single charge pump 330 may be configured to provide a voltage to one or more of the memory blocks 325 during a write operation. Accordingly, the divider may divide the voltage from the charge pump 330 by a factor of four (4) (e.g., corresponding to each of the four (4) memory blocks 325). In other examples, the divider may divide the voltage from the charge pump by a factor corresponding to a quantity of memory cells being written. That is, the divider may divide the voltage from the charge pump 330 in order to obtain (e.g., determine) a voltage used to write data to one or more memory cells.

The comparison circuitry 335 may also include a voltage source configured to provide a reference voltage to the comparator. The reference voltage may represent the expected voltage (e.g., theoretical voltage) for writing the data to the memory cells. The comparator may be configured to receive the voltage from the divider and compare the voltage to the reference voltage provided by the voltage source.

In some cases, the memory system 310 may receive a write command from the host system 305. By way of example, the write command may include data to be written to one or more memory cells in the memory block 325-*a*. The memory system controller 315 may activate the charge pump 330 coupled with the memory block 325-*a* to generate a first voltage for writing the data to the memory cells in the memory block 325-*a*. The charge pump 330 may apply the first voltage to a rail (e.g., a voltage rail) associated with the memory block 325-*a*. The divider may sample the first voltage generated from the charge pump 330 and divide the first voltage by a factor as described herein. The resulting voltage, which may be provided to the comparator, may represent a voltage used to write data to one or more memory cells of the memory block 325-*a*. Similarly, the voltage source may provide a second voltage (e.g., reference voltage) to the comparator.

The comparison circuitry 335 may compare the first voltage generated using the charge pump 330 and the divider to the second voltage. Specifically, the comparison circuitry 335 may determine whether the first voltage (e.g., the write voltage) is within a threshold tolerance (e.g., within a range) associated with the second voltage. For example, although the first voltage may be a different voltage than the second voltage, the difference in voltages may not have introduced any errors into the associated data. Thus, the comparison circuitry 335 may determine whether the first voltage is within the threshold tolerance (e.g., within, for example, ±10%) of the second voltage.

In some cases, the first voltage may not satisfy the threshold tolerance and the comparison circuitry 335 may generate signaling indicating (e.g., to the memory system controller 315) the potential occurrence of one or more errors associated with the written data. In some examples, the signaling may trigger a system interrupt, where based on receiving the signaling, the memory system controller 315 may pause (e.g., suspend, temporarily suspend) ongoing operations (e.g., receiving and processing access commands, such as writing data to the memory cells) to analyze the associated data for errors. In some other examples, the comparison circuitry 335 may generate a flag, where the flag is stored to a register 345 of the memory system 310. The memory system controller 315 may be configured to periodically (e.g., between access operations, at a predetermined interval) read the contents of the register. Based on the flag being stored to the register, the memory system controller 315 may analyze the associated data for errors. In some cases, the comparison circuitry 335 may refrain from generating signaling based on identifying that a quantity of errors in the written data is less than a threshold value (e.g., an acceptable quantity of errors).

In some cases, based on receiving the signaling, the memory system controller 315 may activate a decoder 340 (e.g., a low-density parity check (LPDC) decoder) of the memory system to decode the data written to the memory cells to determine whether one or more errors occurred during the associated write operation. The decoder 340 may identify the data written to the memory cells and detect if one or more errors occurred using an error detection scheme, such as a linear error detection scheme. For example, the decoder 340 may identify a quantity of errors in the data written to the memory cells and determine whether the quantity of errors satisfies (e.g., is above) a threshold value. In some instances, the threshold value may be based on a quantity of bit flips relative to a total quantity of bits written (e.g., 0.1% bits flips of the total bits written).

The decoder 340 may determine the quantity of errors by determining a quantity of error bit-flips in the data and comparing the quantity of the error bit flips to the threshold value. In some examples, the decoder 340 may determine that the quantity of errors satisfies the threshold value and may transmit signaling to the memory system controller 315 indicating such. In some implementations, the memory system controller 315 may transfer (e.g., move) the data from the memory cells of the memory block 325-*a* to the memory cells of another memory block 325 (e.g., the memory block 325-*b*) by reading the data from the memory block 325-*a* and writing the data to the memory block 325-*b*. The memory system controller 315 may disable the memory block 325-*a* for future access operations.

In some other implementations, the memory system controller 315 may generate signaling indicating the quantity of errors satisfies the threshold value and may transmit the second signaling to the host system 305. The second signaling may request that the host system 305 transmit (e.g., retransmit) the write command. Based on receiving the write command (e.g., for a second time), the memory system controller 315 may write the data associated with the write command to the memory block 325-*b*. Additionally, or alternatively, the memory system controller 315 may disable the memory block 325-*a*, erase the data from the memory block 325-*a*, or both.

In some cases, the first voltage may satisfy the threshold tolerance and the comparison circuitry may refrain from generating any signaling. Accordingly, when the first voltage satisfies the threshold tolerance, an error may not have occurred (or a relatively low quantity of errors may have occurred) while writing data to the memory array 320 and thus the memory system controller 315 may continue performing any ongoing operations without being interrupted. In some examples, when the threshold value is not satisfied, the error may be a false positive or may otherwise indicate that the data does not include a critical quantity of errors. By selectively determining whether data includes one or more errors, the memory system 310 may operate with a relatively low latency while also ensuring the validity of data stored to its memory cells.

Figure 4:
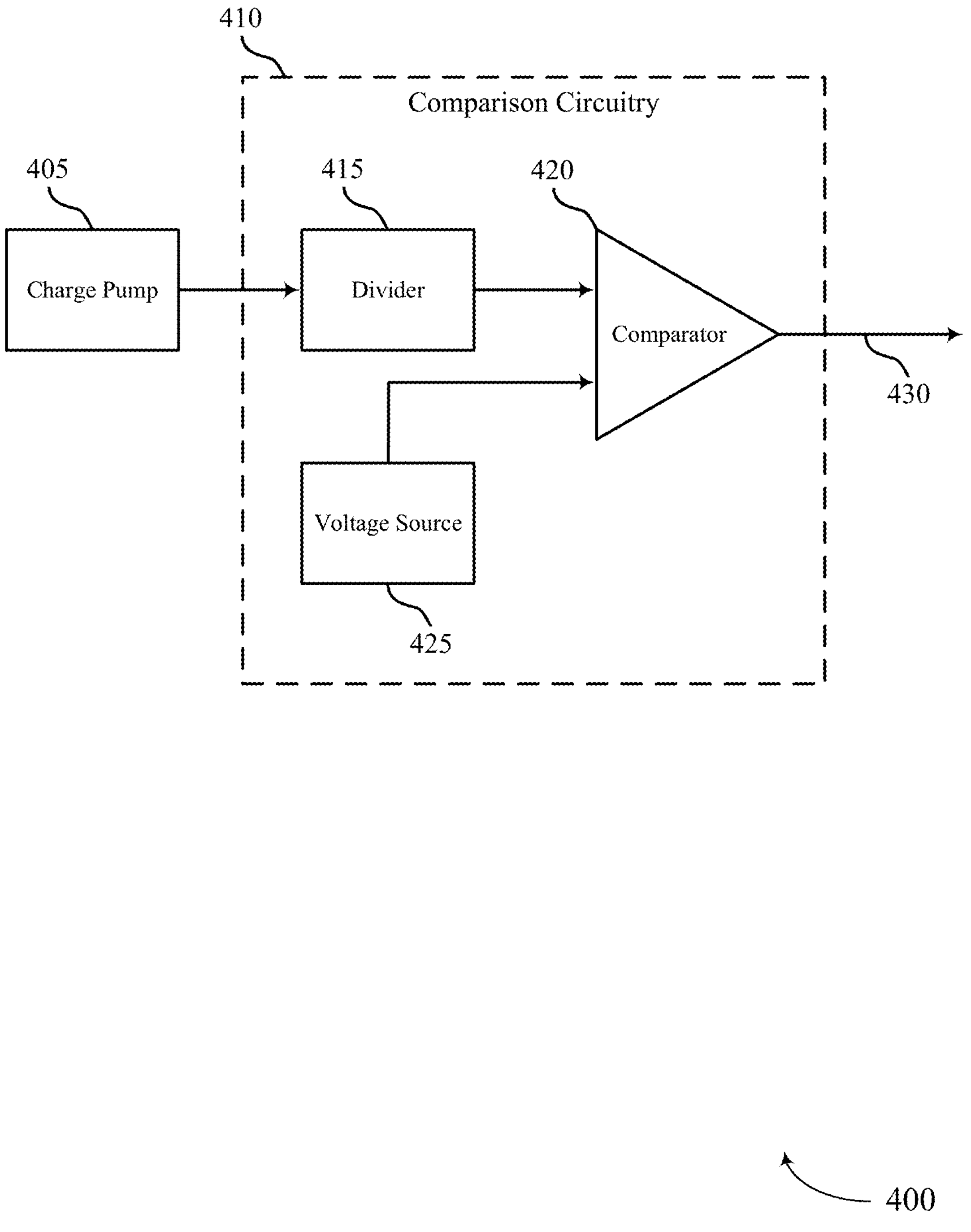
FIG. 4 illustrates an example of a circuit that supports error detection for programming single level cells in accordance with examples as disclosed herein.

FIG. 4 illustrates an example of a circuit diagram 400 that supports error detection for programming single level cells in accordance with examples as disclosed herein. The circuit diagram 400 may implement aspects of the memory system 310 as described with reference to FIG. 3. For example, charge pump 405 may be an example of the charge pump 330 and comparison circuitry 410 may be an example of the comparison circuitry 335, as described with reference to FIG. 3, respectively. Aspects of the circuit diagram 400 may be omitted from FIG. 4 for illustrative clarity, such as a memory system controller which may be an example of the memory system controller 315 as described with reference to FIG. 3. In some cases, the circuit diagram may include components configured to detect the occurrence of one or more errors associated with writing data to memory cells of a memory block based on comparing a voltage applied to write the data to the memory cells to an expected voltage (e.g., a theoretical voltage) to write the data. By selectively determining whether data includes one or more errors, the associated memory system may operate with a relatively low latency while also ensuring the validity of data stored to its memory cells.

The circuit diagram 400 may include a charge pump 405 coupled with comparison circuitry 410. The charge pump 405 may be activated by a write command to generate a first voltage for writing data to the memory cells. The comparison circuitry 410 may include a divider 415 coupled with the charge pump 405, and further coupled with a comparator 420. The divider 415 may be configured to sample the first voltage from the charge pump 405 and divide the first voltage by a factor as described herein. The divider 415 may provide the first voltage (e.g., the divided first voltage) to a comparator 420. The comparison circuitry 410 may also include a voltage source 425 configured to provide a second voltage to the comparator 420, where the second voltage may be a reference voltage (e.g., an expected voltage or theoretical voltage) for writing the data to the memory cells. The comparator 420 may be configured to receive the first voltage from the divider 415 and compare the first voltage to the second voltage provided by the voltage source 425.

In some examples, the divider 415 may divide the first voltage by a factor associated with the quantity of memory cells being written by the charge pump. For example, over time the memory cells may degrade physically (e.g., wear down, wear out) due to the quantity of program erase cycles performed. Accordingly, such memory cells may have a relatively higher threshold voltage, thus the factor may be adjusted to account for such characteristics. In such an example, the divider 415 may use a relatively lower factor to divide the first voltage. Thus, the factor used by the divider 415 may be based on an age of the associated memory cells, a quantity of program erase cycles performed on the associated memory cells, or other similar characteristics, and may be set by signaling received from a host system, by a memory controller, or by another component of the memory system.

The comparator 420 may compare the first voltage (e.g., the voltage generated using the charge pump 330 and the divider) to the second voltage. The comparator 420 may determine whether the first voltage applied to the memory cells is within a threshold tolerance (e.g., acceptable range) associated with the second voltage. Specifically, the comparator 420 may compare the first voltage to the second voltage to determine whether the first voltage is greater than or less than the second voltage and output a value based on the determination. For example, if the first voltage is greater than the second voltage, the comparator 420 may output signaling 430 having a first value (e.g., a 0 or 1) and if the first voltage is less than the second voltage, the comparator 420 may output signaling 430 having a second value (e.g., 0 or 1, different from the first value). In some cases, the first value may indicate that no or relatively few errors may have occurred during the write operation, and the second value may indicate a critical quantity of errors may have occurred.

Therefore, to avoid cases when the first value indicates that no or relatively few errors may have occurred during the write operation despite the first voltage being above the threshold tolerance of the second voltage, the comparator 420 may be configured accordingly. For example, the comparator 420 may be configured based on a likelihood of one or more errors occurring. Accordingly, if a critical quantity of errors is more likely to occur when the first voltage exceeds the threshold tolerance of the second voltage, the comparator 420 may be configured to output a value to trigger an interrupt when the first voltage exceeds the second voltage. Similarly, if a critical quantity of errors is more likely to occur when the first voltage falls below the threshold tolerance of the second voltage, the comparator 420 may be configured to output a value to trigger an interrupt when the first voltage falls below the second voltage. Accordingly, the configuration of the comparator 420 may be a matter of design choice and, in some instances, may be configurable.

In some cases, the first voltage may not satisfy the threshold tolerance and the comparator 420 may generate signaling indicating the potential occurrence of one or more errors while writing the data to the memory cells. In some examples, the signaling may trigger a system interrupt, where based on receiving the signaling, a memory system may pause (e.g., suspend, temporarily suspend) ongoing operations (e.g., receiving and processing access commands, such as writing data to the memory cells) to analyze the associated data for errors.

In some other examples, the comparator 420 may generate a flag that is stored to a register of the associated memory system. The memory system may be configured to periodically (e.g., between access operations, at a predetermined interval) read the contents of the register. Based on the flag being stored to the register, the memory system may analyze the associated data for errors. In some cases, the comparator 420 may refrain from generating signaling based on identifying that a quantity of errors in the written data is less than a threshold value (e.g., an acceptable quantity of errors). By selectively determining whether data includes one or more errors, the memory system may operate with a relatively low latency while also ensuring the validity of data stored to its memory cells.

Figure 5:
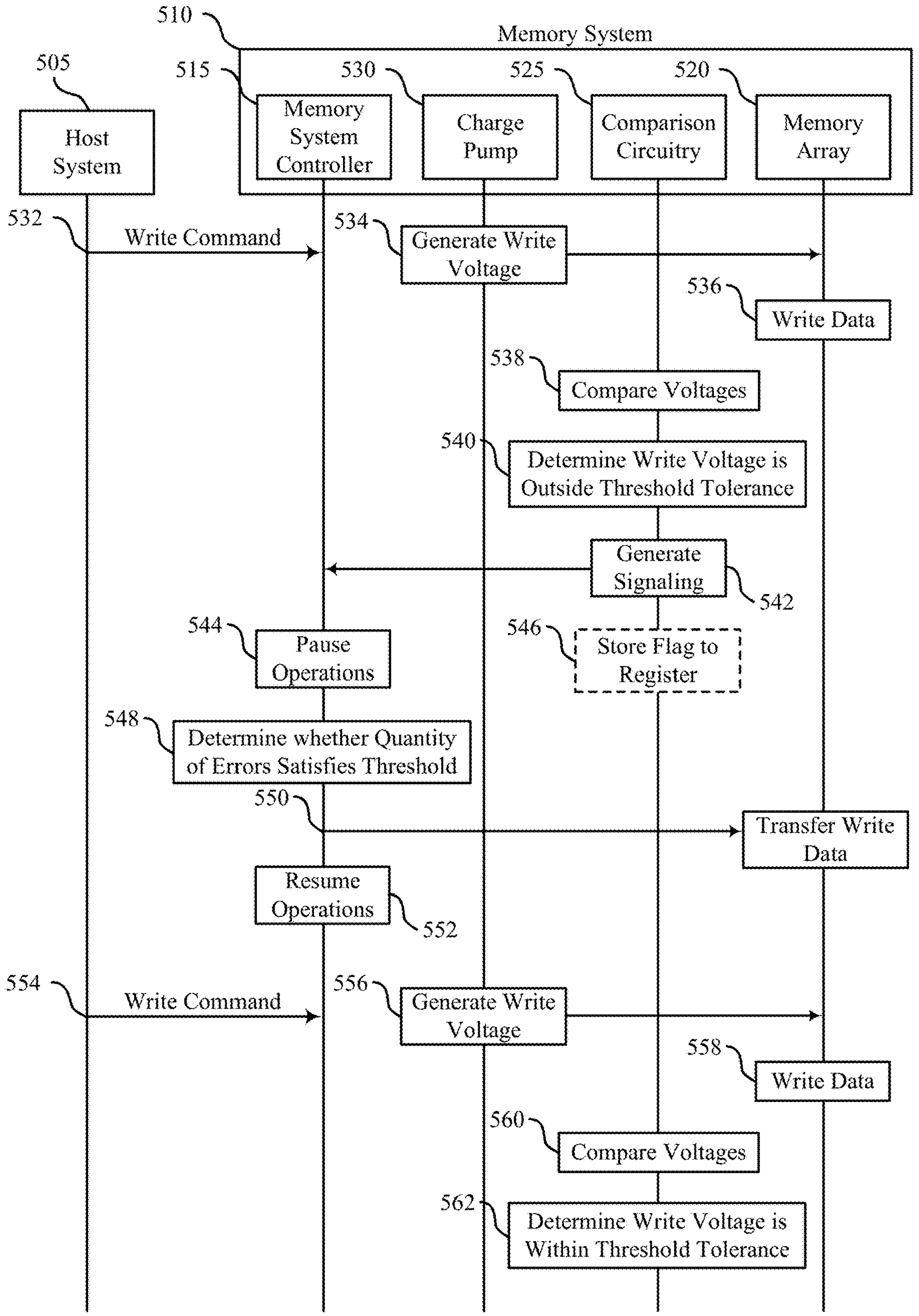
FIG. 5 illustrates an example of a process flow diagram that supports error detection for programming single level cells in accordance with examples as disclosed herein.

FIG. 5 illustrates an example of a process flow diagram 500 that supports error detection for programming single level cells in accordance with examples as disclosed herein. The process flow diagram 500 may illustrate aspects or operations of a system 300 as described with reference to FIG. 3. For example, the process flow diagram 500 may depict operations at a host system 505 and a memory system 510, which may be examples of host system 105, 205, and 305 and memory system 110, 210, and 310, as described with reference to FIGS. 1, 2, and 3 respectively. By selectively determining whether data includes one or more errors, the memory system 510 may operate with a relatively low latency while also ensuring the validity of data stored to its memory cells.

At 532, the host system 505 may transmit a write command (e.g., a first write command) to the memory system 510. The write command may include data to be written to one or more memory cells (e.g., one or more blocks of memory cells) of a memory array 520 of the memory system 510 and may be received by a memory system controller 515 of the memory system 510. The memory array 520 may be an example of a non-volatile memory array (e.g., a NAND memory array).

At 534, the memory system controller 515 may activate a charge pump 530 to generate a first voltage to write the data (e.g., indicated by the write command) to the memory cells of the memory array 520. At 536, data may be written to the memory array 520 using the first voltage generated by the charge pump 530.

At 538, the comparison circuitry 525 may sample the first voltage used to write the data to the memory array 520 and may compare the first voltage to a second voltage (e.g., expected voltage, theoretical voltage, constant voltage). The comparator may receive the first voltage from the divider as described herein, and may receive the second voltage from a voltage source coupled with the comparator.

At 540, the comparison circuitry 525 may determine that the first voltage is outside of a threshold tolerance associated with the second voltage. For example, the comparison circuitry 525 may determine the first voltage does not satisfy the threshold tolerance associated with the second voltage. At 542, the comparison circuitry 525 may generate signaling based on determining that the first voltage is outside of a threshold tolerance associated with the second voltage. As described herein, the signaling may result in a flag being stored to a register or may interrupt one or more ongoing operations of the associated memory system.

At 544, the memory system controller 515 may pause one or more ongoing operations based on receiving the system interrupt from the comparison circuitry 525. For example, the memory system controller 515 may suspend (e.g., temporarily suspend) operations associated with commands received from the host system 505. While operations are suspended, the associated data may be decoded (e.g., by a decoder of the memory system 510).

At 546, the comparison circuitry 525 may optionally store a flag to the register of the memory system 510 at a first duration. The memory system controller 515 may be configured to periodically check the register for flags, such that the memory system controller 515 may check the register at a second duration after the first duration and detect that the flag has been stored. The presence of a flag may result in the associated data being decoded (e.g., by a decoder of the memory system 510).

At 548, the memory system controller 515 may determine whether a quantity of errors associated with the data satisfies a threshold value. For example, the memory system controller 515 may compare the quantity of errors in the data to the threshold (e.g., an acceptable tolerance of errors) and determine whether the data includes more errors than the threshold. In some cases, the memory system controller 515 may determine that the quantity of errors in the data satisfies the threshold (e.g., has a greater quantity of errors than the threshold).

At 550, the memory system controller 515 may transfer the data written to the memory cells (e.g., at 536) to memory cells of another block (e.g., a second block of memory cells) of the memory array 520. The memory system controller 515 may transfer the data by reading the data from the memory cells and writing the data to the memory cells of the second memory block. In some cases, the memory system controller 515 may generate second signaling and transmit the signaling to the host system 505. The second signaling may indicate that the quantity of errors in the data satisfies the threshold and may further request retransmission of the write command or the data indicated in the write command.

At 552, the memory system controller 515 may resume ongoing operations of the memory system 510. In some cases, the memory system controller 515 may resume ongoing operations based on transferring the data to the second memory block or based on generating the second signaling. In other cases, the memory system controller 515 may resume ongoing operations based on determining the quantity of errors does not satisfy the threshold. Resuming ongoing operations may enable the memory system 510 to receive and execute access operations (e.g., a second write command) issued prior to or subsequent to pausing the ongoing operations.

At 554, the memory system 510 may receive another write command (e.g., a second write command) from the host system 505. The memory system controller 515 may receive the command and initialize executing the write command on the same memory cells of the memory block or memory cells of another memory block of the memory array 520.

At 556, the charge pump 530 may generate a third voltage to write the data associated with the second write command to the memory array 520. At 558, the memory system controller 515 may activate a charge pump 530 to generate a third voltage to write the data (e.g., indicated by the second write command) to the memory cells of the memory array 520. At 560, data may be written to the memory array 520 using the third voltage generated by the charge pump 530.

At 560, the comparison circuitry 525 may sample the third voltage used to write the data to the memory array 520 and may compare the third voltage to a fourth voltage (e.g., a second expected voltage, a second theoretical voltage, a second constant voltage). The comparator may receive the third voltage from the divider as described herein, and may receive the fourth voltage from a voltage source coupled with the comparator.

At 562, the comparison circuitry 525 may determine that the third voltage is within a threshold tolerance associated with the fourth voltage. For example, the comparison circuitry 525 may determine the third voltage satisfies the threshold tolerance associated with the fourth voltage. In such examples, the data written to the memory array 520 may not include a critical quantity of errors. By selectively determining whether data includes one or more errors, the memory system 510 may operate with a relatively low latency while also ensuring the validity of data stored to its memory cells.

Figure 6:
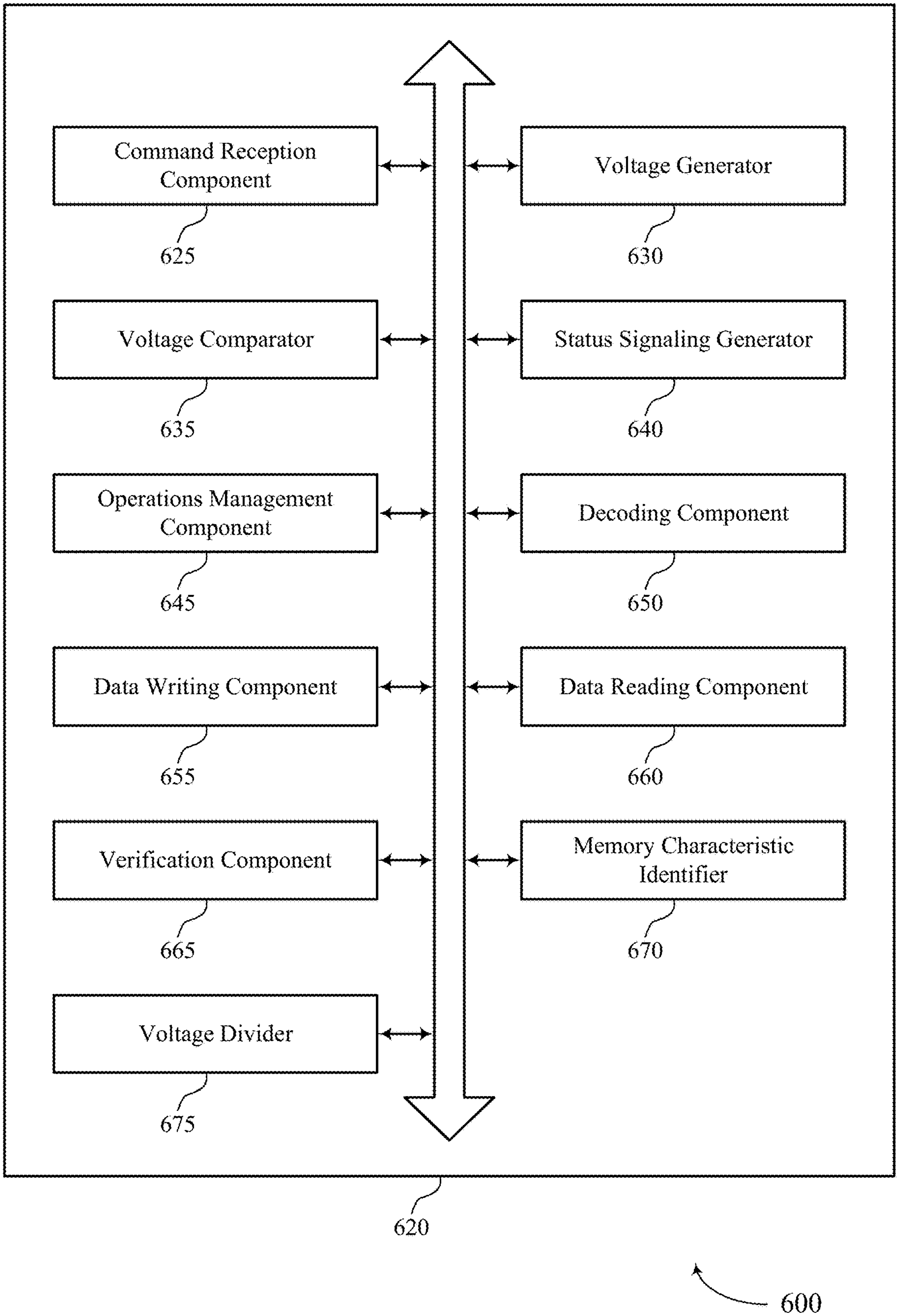
FIG. 6 shows a block diagram of a memory system that supports error detection for programming single level cells in accordance with examples as disclosed herein.

FIG. 6 shows a block diagram 600 of a memory system 620 that supports error detection for programming single level cells in accordance with examples as disclosed herein. The memory system 620 may be an example of aspects of a memory system as described with reference to FIGS. 1 through 5. The memory system 620, or various components thereof, may be an example of means for performing various aspects of error detection for programming single level cells as described herein. For example, the memory system 620 may include a command reception component 625, a voltage generator 630, a voltage comparator 635, a status signaling generator 640, an operations management component 645, a decoding component 650, a data writing component 655, a data reading component 660, a verification component 665, a memory characteristic identifier 670, a voltage divider 675, or any combination thereof. Each of these components may communicate, directly or indirectly, with one another (e.g., via one or more buses).

The command reception component 625 may be configured as or otherwise support a means for receiving, by a memory device, a write command for writing data to a block of memory cells of the memory device. The voltage generator 630 may be configured as or otherwise support a means for generating a first voltage to write the data to the block of memory cells of the memory device based at least in part on receiving the write command. The voltage comparator 635 may be configured as or otherwise support a means for comparing the first voltage to a second voltage including a reference voltage for writing the data to the block of memory cells of the memory device. In some examples, the voltage comparator 635 may be configured as or otherwise support a means for determining that the first voltage does not satisfy a threshold tolerance associated with the second voltage based at least in part on comparing the first voltage to the second voltage. The status signaling generator 640 may be configured as or otherwise support a means for generating, based at least in part on determining that the first voltage does not satisfy the threshold tolerance associated with the second voltage, signaling indicating an error associated with writing the data to the block of memory cells of the memory device.

In some examples, the data is written to one or more memory cells of the block of memory cells of the memory device based at least in part on receiving the write command, and the operations management component 645 may be configured as or otherwise support a means for pausing, by the memory device, one or more ongoing operations based at least in part on generating the signaling. In some examples, the data is written to one or more memory cells of the block of memory cells of the memory device based at least in part on receiving the write command, and the decoding component 650 may be configured as or otherwise support a means for decoding the data written to the block of memory cells of the memory device based at least in part on pausing the one or more ongoing operations.

In some examples, to support decoding the data written to the block of memory cells, the verification component 665 may be configured as or otherwise support a means for determining a quantity of errors associated with the data written to the block of memory cells of the memory device.

In some examples, the verification component 665 may be configured as or otherwise support a means for determining that the quantity of errors associated with the data written to the block of memory cells of the memory device satisfies a threshold value. In some examples, the data reading component 660 may be configured as or otherwise support a means for reading second data stored to the block of memory cells based at least in part on determining that the quantity of errors associated with the data written to the block of memory cells satisfies the threshold value. In some examples, the data writing component 655 may be configured as or otherwise support a means for writing the second data to a second block of memory cells of the memory device.

In some examples, the verification component 665 may be configured as or otherwise support a means for determining that the quantity of errors associated with the data written to the block of memory cells of the memory device satisfies a threshold value. In some examples, the status signaling generator 640 may be configured as or otherwise support a means for generating second signaling based at least in part on determining that the quantity of errors associated with the data written to the block of memory cells of the memory device satisfies the threshold value, the second signaling indicating an error associated with the data. In some examples, the status signaling generator 640 may be configured as or otherwise support a means for transmitting the second signaling to a host system.

In some examples, the command reception component 625 may be configured as or otherwise support a means for receiving, by the memory device, a second write command for writing the data to a third block of memory cells of the memory device based at least in part on transmitting the second signaling to the host system. In some examples, the data writing component 655 may be configured as or otherwise support a means for writing the data to the third block of memory cells based at least in part on receiving the second write command.

In some examples, the verification component 665 may be configured as or otherwise support a means for determining that the quantity of errors associated with the data written to the block of memory cells of the memory device does not satisfy a threshold value. In some examples, the operations management component 645 may be configured as or otherwise support a means for resuming the one or more ongoing operations based at least in part on determining that the quantity of errors associated with the data written to the block of memory cells of the memory device does not satisfy the threshold value.

In some examples, to support generating the first voltage to write the data to the block of memory cells, the operations management component 645 may be configured as or otherwise support a means for activating a charge pump coupled with a plurality of blocks of memory cells that includes the block of memory cells. In some examples, to support generating the first voltage to write the data to the block of memory cells, the operations management component 645 may be configured as or otherwise support a means for outputting, from the charge pump, a third voltage based at least in part on activating the charge pump. In some examples, to support generating the first voltage to write the data to the block of memory cells, the voltage generator 630 may be configured as or otherwise support a means for applying a portion of the third voltage to each block of memory cells of the plurality of blocks of memory cells, where the portion of the third voltage applied to the block of memory cells includes the first voltage.

In some examples, the memory characteristic identifier 670 may be configured as or otherwise support a means for determining one or more characteristics of memory cells memory cells of the plurality of blocks of memory cells. In some examples, the voltage divider 675 may be configured as or otherwise support a means for dividing the third voltage output from the charge pump by a factor associated with the one or more characteristics of the memory cells of the plurality of blocks of memory cells, where the portion of the third voltage applied to each block of memory cells of the plurality of blocks of memory cells is based at least in part on dividing the third voltage output from the charge pump by the factor.

In some examples, the data writing component 655 may be configured as or otherwise support a means for storing, during a first duration, a value to a register of the memory device based at least in part on generating the signaling. In some examples, the data reading component 660 may be configured as or otherwise support a means for reading, during a second duration after the first duration, the value from the register of the memory device based at least in part on storing the value to the register of the memory device. In some examples, the decoding component 650 may be configured as or otherwise support a means for decoding the data written to the block of memory cells of the memory device based at least in part on reading the value from the register of the memory device.

In some examples, the verification component 665 may be configured as or otherwise support a means for determining that a quantity of errors associated with the data written to the block of memory cells of the memory device satisfies a second threshold value based at least in part on decoding the data. In some examples, the data reading component 660 may be configured as or otherwise support a means for reading third data stored to the block of memory cells based at least in part on determining that the quantity of errors associated with the data written to the block of memory cells satisfies the second threshold value. In some examples, the data writing component 655 may be configured as or otherwise support a means for writing the third data to a fourth block of memory cells of the memory device.

In some examples, the command reception component 625 may be configured as or otherwise support a means for receiving, by a memory device, a third write command for writing second data to a fourth block of memory cells of the memory device. In some examples, the voltage generator 630 may be configured as or otherwise support a means for generating a fourth voltage to write the data to the block of memory cells of the memory device based at least in part on receiving the third write command. In some examples, the voltage comparator 635 may be configured as or otherwise support a means for comparing the fourth voltage to a fifth voltage based at least in part on generating the fourth voltage, where the fifth voltage includes a reference voltage for writing the second data to the fourth block of memory cells of the memory device. In some examples, the voltage comparator 635 may be configured as or otherwise support a means for determining that the fourth voltage satisfies a third threshold tolerance associated with the fifth voltage based at least in part on comparing the fourth voltage to the fifth voltage. In some examples, the status signaling generator 640 may be configured as or otherwise support a means for refraining from generating signaling based at least in part on determining that the fourth voltage satisfies the third threshold tolerance associated with the fifth voltage.

In some examples, the data writing component 655 may be configured as or otherwise support a means for writing the data to the block of memory cells of the memory device using a first type of write operation based at least in part on receiving the write command, where the first type of write operation is different than a second type of write operation and a third type of write operation.

In some examples, the signaling indicates an occurrence of at least one error associated with writing the data to the block of memory cells of the memory device.

In some examples, the reference voltage includes an expected voltage for writing the data to the block of memory cells of the memory device.

Figure 7:
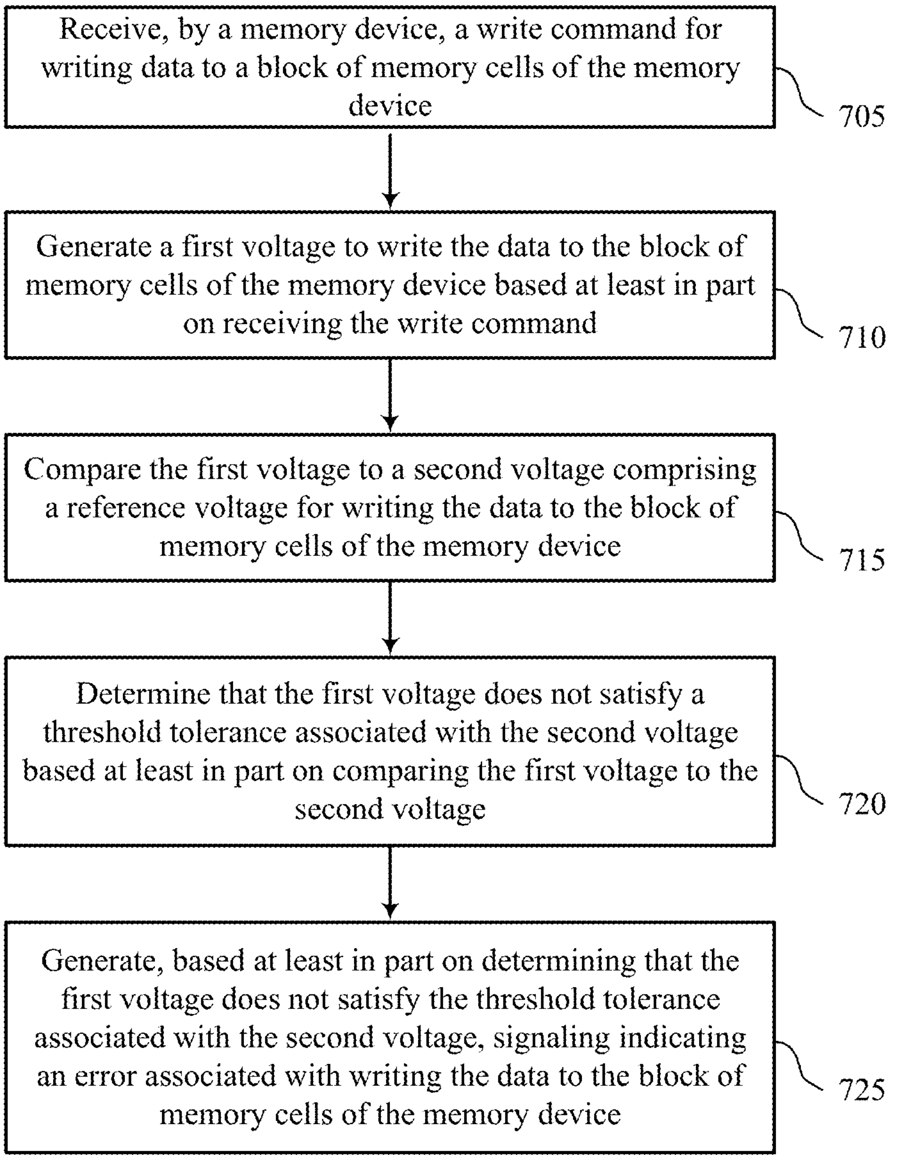
FIG. 7 shows a flowchart illustrating a method or methods that support error detection for programming single level cells in accordance with examples as disclosed herein.

FIG. 7 shows a flowchart illustrating a method 700 that supports error detection for programming single level cells in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally, or alternatively, the memory system may perform aspects of the described functions using special-purpose hardware.

At 705, the method may include receiving, by a memory device, a write command for writing data to a block of memory cells of the memory device. The operations of 705 may be performed in accordance with examples as disclosed herein. In some examples, aspects of the operations of 705 may be performed by a command reception component 625 as described with reference to FIG. 6.

At 710, the method may include generating a first voltage to write the data to the block of memory cells of the memory device based at least in part on receiving the write command. The operations of 710 may be performed in accordance with examples as disclosed herein. In some examples, aspects of the operations of 710 may be performed by a voltage generator 630 as described with reference to FIG. 6.

At 715, the method may include comparing the first voltage to a second voltage including a reference voltage for writing the data to the block of memory cells of the memory device. The operations of 715 may be performed in accordance with examples as disclosed herein. In some examples, aspects of the operations of 715 may be performed by a voltage comparator 635 as described with reference to FIG. 6.

At 720, the method may include determining that the first voltage does not satisfy a threshold tolerance associated with the second voltage based at least in part on comparing the first voltage to the second voltage. The operations of 720 may be performed in accordance with examples as disclosed herein. In some examples, aspects of the operations of 720 may be performed by a voltage comparator 635 as described with reference to FIG. 6.

At 725, the method may include generating, based at least in part on determining that the first voltage does not satisfy the threshold tolerance associated with the second voltage, signaling indicating an error associated with writing the data to the block of memory cells of the memory device. The operations of 725 may be performed in accordance with examples as disclosed herein. In some examples, aspects of the operations of 725 may be performed by a status signaling generator 640 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, by a memory device, a write command for writing data to a block of memory cells of the memory device; generating a first voltage to write the data to the block of memory cells of the memory device based at least in part on receiving the write command; comparing the first voltage to a second voltage including a reference voltage for writing the data to the block of memory cells of the memory device; determining that the first voltage does not satisfy a threshold tolerance associated with the second voltage based at least in part on comparing the first voltage to the second voltage; and generating, based at least in part on determining that the first voltage does not satisfy the threshold tolerance associated with the second voltage, signaling indicating an error associated with writing the data to the block of memory cells of the memory device.

Aspect 2: The method, apparatus, or non-transitory computer-readable medium of aspect 1, where the data is written to one or more memory cells of the block of memory cells of the memory device based at least in part on receiving the write command and the method, apparatuses, and non-transitory computer-readable medium further includes operations, features, circuitry, logic, means, or instructions, or any combination thereof for pausing, by the memory device, one or more ongoing operations based at least in part on generating the signaling and decoding the data written to the block of memory cells of the memory device based at least in part on pausing the one or more ongoing operations.

Aspect 3: The method, apparatus, or non-transitory computer-readable medium of aspect 2, where decoding the data written to the block of memory cells includes operations, features, circuitry, logic, means, or instructions, or any combination thereof for determining a quantity of errors associated with the data written to the block of memory cells of the memory device.

Aspect 4: The method, apparatus, or non-transitory computer-readable medium of aspect 3, further including operations, features, circuitry, logic, means, or instructions, or any combination thereof for determining that the quantity of errors associated with the data written to the block of memory cells of the memory device satisfies a threshold value; reading second data stored to the block of memory cells based at least in part on determining that the quantity of errors associated with the data written to the block of memory cells satisfies the threshold value; and writing the second data to a second block of memory cells of the memory device.

Aspect 5: The method, apparatus, or non-transitory computer-readable medium of any of aspects 3 through 4, further including operations, features, circuitry, logic, means, or instructions, or any combination thereof for determining that the quantity of errors associated with the data written to the block of memory cells of the memory device satisfies a threshold value; generating second signaling based at least in part on determining that the quantity of errors associated with the data written to the block of memory cells of the memory device satisfies the threshold value, the second signaling indicating an error associated with the data; and transmitting the second signaling to a host system.

Aspect 6: The method, apparatus, or non-transitory computer-readable medium of aspect 5, further including operations, features, circuitry, logic, means, or instructions, or any combination thereof for receiving, by the memory device, a second write command for writing the data to a third block of memory cells of the memory device based at least in part on transmitting the second signaling to the host system and writing the data to the third block of memory cells based at least in part on receiving the second write command.

Aspect 7: The method, apparatus, or non-transitory computer-readable medium of any of aspects 3 through 6, further including operations, features, circuitry, logic, means, or instructions, or any combination thereof for determining that the quantity of errors associated with the data written to the block of memory cells of the memory device does not satisfy a threshold value and resuming the one or more ongoing operations based at least in part on determining that the quantity of errors associated with the data written to the block of memory cells of the memory device does not satisfy the threshold value.

Aspect 8: The method, apparatus, or non-transitory computer-readable medium of any of aspects 1 through 7, where generating the first voltage to write the data to the block of memory cells includes operations, features, circuitry, logic, means, or instructions, or any combination thereof for activating a charge pump coupled with a plurality of blocks of memory cells that includes the block of memory cells;

outputting, from the charge pump, a third voltage based at least in part on activating the charge pump; and applying a portion of the third voltage to each block of memory cells of the plurality of blocks of memory cells, where the portion of the third voltage applied to the block of memory cells includes the first voltage.

Aspect 9: The method, apparatus, or non-transitory computer-readable medium of aspect 8, further including operations, features, circuitry, logic, means, or instructions, or any combination thereof for determining one or more characteristics of memory cells memory cells of the plurality of blocks of memory cells and dividing the third voltage output from the charge pump by a factor associated with the one or more characteristics of the memory cells of the plurality of blocks of memory cells, where the portion of the third voltage applied to each block of memory cells of the plurality of blocks of memory cells is based at least in part on dividing the third voltage output from the charge pump by the factor.

Aspect 10: The method, apparatus, or non-transitory computer-readable medium of any of aspects 1 through 9, further including operations, features, circuitry, logic, means, or instructions, or any combination thereof for storing, during a first duration, a value to a register of the memory device based at least in part on generating the signaling; reading, during a second duration after the first duration, the value from the register of the memory device based at least in part on storing the value to the register of the memory device; and decoding the data written to the block of memory cells of the memory device based at least in part on reading the value from the register of the memory device.

Aspect 11: The method, apparatus, or non-transitory computer-readable medium of aspect 10, further including operations, features, circuitry, logic, means, or instructions, or any combination thereof for determining that a quantity of errors associated with the data written to the block of memory cells of the memory device satisfies a second threshold value based at least in part on decoding the data; reading third data stored to the block of memory cells based at least in part on determining that the quantity of errors associated with the data written to the block of memory cells satisfies the second threshold value; and writing the third data to a fourth block of memory cells of the memory device.

Aspect 12: The method, apparatus, or non-transitory computer-readable medium of any of aspects 1 through 11, further including operations, features, circuitry, logic, means, or instructions, or any combination thereof for receiving, by a memory device, a third write command for writing second data to a fourth block of memory cells of the memory device; generating a fourth voltage to write the data to the block of memory cells of the memory device based at least in part on receiving the third write command; comparing the fourth voltage to a fifth voltage based at least in part on generating the fourth voltage, where the fifth voltage includes a reference voltage for writing the second data to the fourth block of memory cells of the memory device; determining that the fourth voltage satisfies a third threshold tolerance associated with the fifth voltage based at least in part on comparing the fourth voltage to the fifth voltage; and refraining from generating signaling based at least in part on determining that the fourth voltage satisfies the third threshold tolerance associated with the fifth voltage.

Aspect 13: The method, apparatus, or non-transitory computer-readable medium of any of aspects 1 through 12, further including operations, features, circuitry, logic, means, or instructions, or any combination thereof for writing the data to the block of memory cells of the memory device using a first type of write operation based at least in part on receiving the write command, where the first type of write operation is different than a second type of write operation and a third type of write operation.

Aspect 14: The method, apparatus, or non-transitory computer-readable medium of aspect 13, where the signaling indicates an occurrence of at least one error associated with writing the data to the block of memory cells of the memory device.

Aspect 15: The method, apparatus, or non-transitory computer-readable medium of any of aspects 1 through 14, where the reference voltage includes an expected voltage for writing the data to the block of memory cells of the memory device.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:

one or more memory arrays; and processing circuitry coupled with the one or more memory arrays and configured to cause the memory system to:

generate a first voltage for writing data to one or more blocks of memory cells of the one or more memory arrays;

determine whether the first voltage satisfies a threshold tolerance range associated with a second voltage comprising a reference voltage based at least in part on comparing the first voltage to the second voltage;

generate, based at least in part on determining that the first voltage does not satisfy the threshold tolerance range associated with the second voltage, signaling indicating one or more errors associated with writing the data to the one or more blocks of memory cells;

write the data to the one or more blocks of memory cells based at least in part on generating the first voltage;

pause one or more ongoing operations of the memory system based at least in part on generating the signaling; and decode the data written to the one or more blocks of memory cells based at least in part on pausing the one or more ongoing operations.

2. The memory system of claim 1, wherein decoding the data comprises the processing circuitry configured to cause the memory system to:

identify a quantity of errors associated with the data written to the one or more blocks of memory cells.

3. The memory system of claim 2, wherein the processing circuitry is further configured to cause the memory system to:

determine whether the quantity of errors satisfies a threshold; and write, based at least in part on determining that the quantity of errors satisfies the threshold, second data from the one or more blocks of memory cells to one or more second blocks of memory cells of the one or more memory arrays.

4. The memory system of claim 2, wherein the processing circuitry is further configured to cause the memory system to:

determine whether the quantity of errors satisfies a threshold; and transmit, to a host system, second signaling indicating the one or more errors based at least in part on determining that the quantity of errors satisfies the threshold.

5. The memory system of claim 2, wherein the processing circuitry is further configured to cause the memory system to:

determine whether the quantity of errors satisfies a threshold; and disable, based at least in part on determining that the quantity of errors satisfies the threshold, the one or more blocks of memory cells from performing one or more access operations.

6. The memory system of claim 2, wherein the processing circuitry is further configured to cause the memory system to:

determine whether the quantity of errors satisfies a threshold; and erase, based at least in part on determining that the quantity of errors satisfies the threshold, second data, comprising at least the data, from the one or more blocks of memory cells.

7. The memory system of claim 2, wherein the processing circuitry is further configured to cause the memory system to:

determine whether the quantity of errors satisfies a threshold; and resume the one or more ongoing operations based at least in part on determining that the quantity of errors does not satisfy the threshold.

8. The memory system of claim 1, wherein the processing circuitry is further configured to cause the memory system to:

store a value to a register of the memory system based at least in part on generating the signaling; and read the value from the register based at least in part on storing the value to the register, wherein decoding the data is based at least in part on reading the value from the register.

9. The memory system of claim 1, wherein the processing circuitry is further configured to cause the memory system to:

receive a write command for writing the data to one or more blocks of memory cells, wherein generating the first voltage is based at least in part on receiving the write command.

10. The memory system of claim 1, wherein the processing circuitry is further configured to cause the memory system to:

generate a third voltage for writing second data to the one or more memory arrays;

determine whether the third voltage satisfies a second threshold tolerance range associated with a fourth voltage comprising a second reference voltage based at least in part on comparing the third voltage to the fourth voltage; and refrain from generating the signaling based at least in part on determining that the third voltage satisfies the second threshold tolerance range.

11. A non-transitory computer-readable medium storing code, the code comprising instructions executable by one or more processors to:

generate a first voltage for writing data to one or more blocks of memory cells of a memory system;

determine whether the first voltage satisfies a threshold tolerance range associated with a second voltage comprising a reference voltage based at least in part on comparing the first voltage to the second voltage;

generate, based at least in part on determining that the first voltage does not satisfy the threshold tolerance range associated with the second voltage, signaling indicating one or more errors associated with writing the data to the one or more blocks of memory cells;

write the data to the one or more blocks of memory cells based at least in part on generating the first voltage;

pause one or more ongoing operations of the memory system based at least in part on generating the signaling; and decode the data written to the one or more blocks of memory cells based at least in part on pausing the one or more ongoing operations.

12. The non-transitory computer-readable medium of claim 11, wherein the instructions to decode the data are executable by the one or more processors to:

identify a quantity of errors associated with the data written to the one or more blocks of memory cells.

13. The non-transitory computer-readable medium of claim 12, wherein the instructions are further executable by the one or more processors to:

determine whether the quantity of errors satisfies a threshold; and write, based at least in part on determining that the quantity of errors satisfies the threshold, second data from the one or more blocks of memory cells to one or more second blocks of memory cells of the memory system.

14. The non-transitory computer-readable medium of claim 12, wherein the instructions are further executable by the one or more processors to:

determine whether the quantity of errors satisfies a threshold; and transmit, to a host system, second signaling indicating the one or more errors based at least in part on determining that the quantity of errors satisfies the threshold.

15. The non-transitory computer-readable medium of claim 12, wherein the instructions are further executable by the one or more processors to:

determine whether the quantity of errors satisfies a threshold; and disable, based at least in part on determining that the quantity of errors satisfies the threshold, the one or more blocks of memory cells from performing one or more access operations.

16. The non-transitory computer-readable medium of claim 12, wherein the instructions are further executable by the one or more processors to:

determine whether the quantity of errors satisfies a threshold; and erase, based at least in part on determining that the quantity of errors satisfies the threshold, second data, comprising at least the data, from the one or more blocks of memory cells.

17. The non-transitory computer-readable medium of claim 12, wherein the instructions are further executable by the one or more processors to:

determine whether the quantity of errors satisfies a threshold; and resume the one or more ongoing operations based at least in part on determining that the quantity of errors does not satisfy the threshold.

18. A method by a memory system, comprising:

generating a first voltage for writing data to one or more blocks of memory cells of the memory system;

determining whether the first voltage satisfies a threshold tolerance range associated with a second voltage comprising a reference voltage based at least in part on comparing the first voltage to the second voltage;

generating, based at least in part on determining that the first voltage does not satisfy the threshold tolerance range associated with the second voltage, signaling indicating one or more errors associated with writing the data to the one or more blocks of memory cells;

writing the data to the one or more blocks of memory cells based at least in part on generating the first voltage;

pausing one or more ongoing operations of the memory system based at least in part on generating the signaling; and decoding the data written to the one or more blocks of memory cells based at least in part on pausing the one or more ongoing operations.

* * * * *